United States Patent
Park et al.

(10) Patent No.: US 8,581,235 B2
(45) Date of Patent: Nov. 12, 2013

(54) RESONANCE TUNNELING DEVICES AND METHODS OF MANUFACTURING THE SAME

(71) Applicant: Electronics and Telecommunications Research Institute, Daejeon (KR)

(72) Inventors: Jonghyurk Park, Daegu (KR); Seung Youl Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/915,851

(22) Filed: Jun. 12, 2013

(65) Prior Publication Data

US 2013/0270522 A1    Oct. 17, 2013

Related U.S. Application Data

(62) Division of application No. 13/368,354, filed on Feb. 8, 2012, now Pat. No. 8,481,347.

(30) Foreign Application Priority Data

Mar. 30, 2011    (KR) .................. 10-2011-0028909

(51) Int. Cl.
  *H01L 29/06*    (2006.01)
(52) U.S. Cl.
  USPC ............... 257/29; 257/E21.09; 257/E29.071; 438/478; 977/774
(58) Field of Classification Search
  USPC ......... 257/29, E29.071, E21.09; 438/20, 478; 977/774
  See application file for complete search history.

(56) References Cited

U.S. PATENT DOCUMENTS

| 6,410,934 | B1 | 6/2002 | Nayfeh et al. | |
|---|---|---|---|---|
| 6,992,298 | B2 | 1/2006 | Nayfeh et al. | |
| 7,851,336 | B2 | 12/2010 | Poplavskyy et al. | |
| 2006/0079455 | A1* | 4/2006 | Gazit et al. | 514/12 |
| 2009/0053536 | A1 | 2/2009 | Kunze et al. | |
| 2009/0308441 | A1 | 12/2009 | Nayfeh et al. | |

OTHER PUBLICATIONS

O. M. Nayfeh et al., "Thin Film Silicon Nanoparticle UV Photodetector", IEEE Photonics Technology Letters, vol. 16, No. 8, pp. 1927-1929, Aug. 2004.

Osama M. Nayfeh et al., "Uniform delivery of silicon nanoparticles on device quality substrates using spin coating from isopropyl alcohol colloids", Applied Physics Letters, vol. 94, pp. 043112-1-043112-3, Jan. 2009.

Jürgen Nelles et al., "Electrical properties of surface functionalized silicon nanoparticles", J Nanopart Res, vol. 12, pp. 1367-1375, Jun. 2009.

* cited by examiner

*Primary Examiner* — Jami M Valentine
(74) *Attorney, Agent, or Firm* — Rabin & Berdo, P.C.

(57) ABSTRACT

Provided are a resonance tunneling device and a method of manufacturing the resonance tunneling device. The resonance tunneling device includes a substrate, a plurality of electrodes disposed on the substrate, and a nanoparticle layer disposed between the electrodes, and doped with an impurity. The nanoparticle layer uses the impurity to exhibit resonance tunneling where a current peak occurs at a target bias voltage applied between the electrodes.

5 Claims, 7 Drawing Sheets

RESONANCE TUNNELING DEVICES AND METHODS OF MANUFACTURING THE SAME

CROSS-REFERENCE TO RELATED APPLICATIONS

This is a Divisional of U.S. application Ser. No. 13/368,354, filed on Feb. 8, 2012, and allowed on Mar. 14, 2013, the subject matter of which is incorporated herein by reference. The parent application Ser. No. 13/368,354 claims priority under 35 U.S.C. §119 of Korean Patent Application No. 10-2011-0028909, filed on Mar. 30, 2011, the entire contents of which are hereby incorporated by reference.

BACKGROUND

The present invention disclosed herein relates to a semiconductor device and a method of manufacturing the semiconductor device, and more particularly, to a resonance tunneling device and a method of manufacturing the resonance tunneling device.

In general, a quantum dot material or a nanoparticle layer may be grown in the form of a thin film on a substrate in situ. Such quantum dot materials and nanoparticle layers are used to develop various devices such as conductors, dielectrics, diodes, transistors, solar cells, and secondary batteries. When a quantum dot material or nanoparticles are used to form an inorganic complex, a mixture thin film may be grown using co-sputtering, evaporation, molecular beam epitaxy (MBE), or chemical vapor deposition (CVD). In this case, a special condition such as a high temperature or vacuum state is required, there are many limitations in a process, and it may be difficult to control growing conditions of nanostructures.

SUMMARY

The present invention provides a resonance tunneling device including a nanoparticle layer formed from a nanoparticle solution, and a method of manufacturing the resonance tunneling device.

The present invention also provides a resonance tunneling device including a nanoparticle layer having resonance tunneling characteristics, and a method of manufacturing the resonance tunneling device.

The present invention also provides a resonance tunneling device and a method of manufacturing the resonance tunneling device, which can enhance and maximize productivity.

Embodiments of the present invention provide resonance tunneling devices including: a substrate; a plurality of electrodes disposed on the substrate; and a nanoparticle layer disposed between the electrodes, and doped with an impurity, wherein the nanoparticle layer uses the impurity to exhibit resonance tunneling where a current peak occurs at a target bias voltage applied between the electrodes.

In some embodiments, the nanoparticle layer may include rod nanoparticles or plate nanoparticles.

In other embodiments, the nanoparticle layer may include silicon.

In still other embodiments, the impurity may include at least one of nitrogen, boron, phosphorus, arsenic, and hydrogen.

In even other embodiments, the resonance tunneling devices may further include: a dielectric disposed under or over the nanoparticle layer; and a gate electrode disposed under or over the dielectric between the electrodes.

In other embodiments of the present invention, methods of manufacturing a resonance tunneling device include: preparing a nanoparticle solution including nanoparticles; and forming a nanoparticle layer on a substrate or between electrodes on the substrate, from the nanoparticle solution, wherein the nanoparticle layer is doped with an impurity to exhibit resonance tunneling where a current peak occurs at a target bias voltage applied between the electrodes.

In some embodiments, the nanoparticle layer may be doped with the impurity through ion implantation.

In other embodiments, the impurity may include phosphorus, and the nanoparticle layer may be doped with the phosphorus through ion implantation using ion implantation source gas including phosphine, and hydrogen phosphide.

In still other embodiments, the preparing of the nanoparticle solution may include: mechanically grinding a target material to form primary particles; etching the primary particles with an etching solution to form a temporary solution including secondary particles; removing supernatants from the temporary solution through a centrifuging process to form a purified solution; and diluting the purified solution with a dispersing solvent.

In even other embodiments, the etching solution may include nitric acid, hydrofluoric acid, and water.

In yet other embodiments, the nitric acid, the hydrofluoric acid, and the water may have a mass ratio of about 50:5:50.

In further embodiments, the dispersing solvent may include isopropyl alcohol (IPA) or methanol.

In still further embodiments, the target material may include silicon.

In even further embodiments, the methods may further include: putting the impurity in the purified solution, and doping the nanoparticles with the impurity in the purified solution.

In yet further embodiments, the methods may further include doping the target material with the impurity.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

The objects, other objectives, features, and advantages of the present invention will be understood without difficulties through preferred embodiments below related to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In this specification, it will also be understood that when another component is referred to as being 'on' one component, it can be directly on the one component, or an intervening third component may also be present. Also, in the figures, the dimensions of components are exaggerated for clarity of illustration. Like reference numerals refer to like elements throughout.

Additionally, embodiments in the detailed description will be described with sectional views as ideal exemplary views of the present invention. In the figures, the dimensions of layers and regions are exaggerated for clarity of illustration. Accordingly, shapes of the exemplary views may be modified according to forming techniques and/or allowable tolerances. Therefore, the embodiments of the present invention are not limited to the specific shape illustrated in the exemplary views, but may include other shapes that may be created according to forming processes. For example, an etched region illustrated as a rectangle may have rounded or curved features. Areas exemplified in the drawings have general properties, and are used to illustrate a specific shape of a device region. Thus, this should not be construed as limited to the scope of the present invention. Also, though terms like a first, a second, and a third are used to describe various components in various embodiments of the present invention, the components are not limited to these terms. These terms are only used to distinguish one component from another component. Embodiments described and exemplified herein include complementary embodiments thereof.

In the following description, the technical terms are used only for explaining a specific exemplary embodiment while not limiting the present invention. The terms of a singular form may include plural forms unless referred to the contrary. The meaning of 'comprises' and/or 'comprising' does not exclude other components besides a mentioned component.

Figure 1:
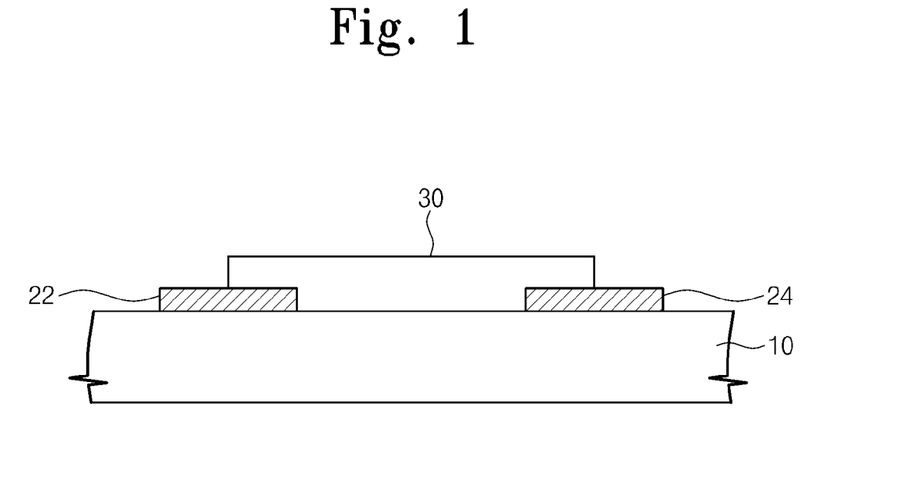
FIG. 1 is a cross-sectional view illustrating a resonance tunneling device according to an embodiment of the present inventive concept.
Figure 2:
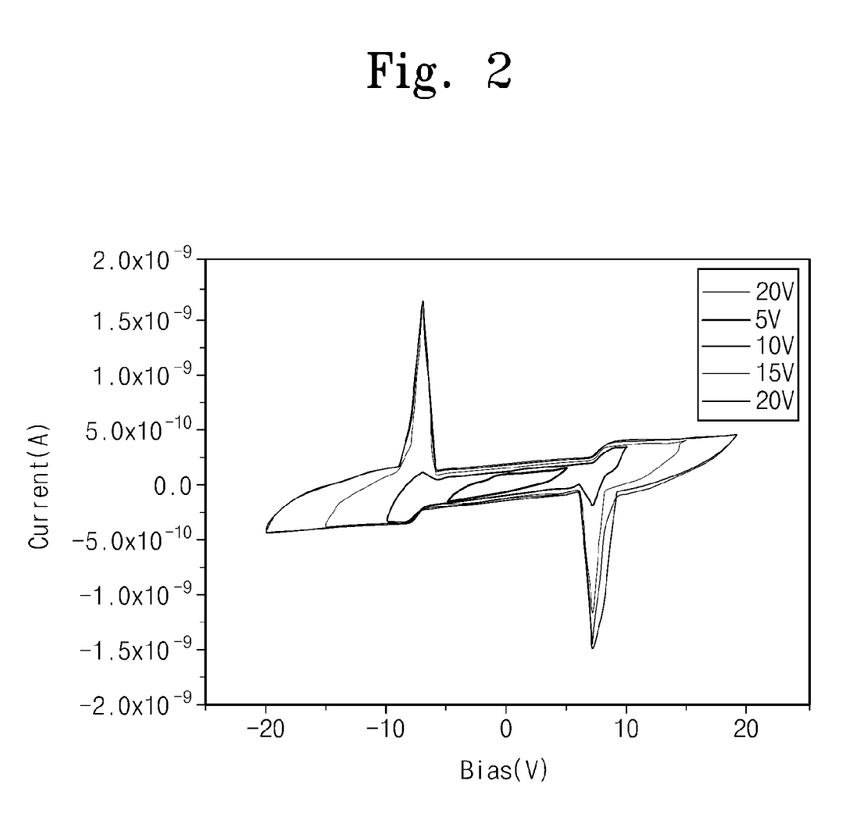
FIG. 2 is a graph illustrating current of the resonance tunneling device of FIG. 1 versus bias voltage.

FIG. 1 is a cross-sectional view illustrating a resonance tunneling device according to an embodiment of the present inventive concept. FIG. 2 is a graph illustrating current of the resonance tunneling device of FIG. 1 versus bias voltage.

Referring to FIGS. 1 and 2, a resonance tunneling device according to the current embodiment may include a nanoparticle layer 30 to exhibit resonance tunneling where current peaks selectively occur at bias voltages of target values applied between a first electrode 22 and a second electrode 24 on a substrate 10. The nanoparticle layer 30 may include silicon. The nanoparticle layer 30 may include rod nanoparticles having a length ranging from about 50 nm to about 200 nm, or plate nanoparticles having an area ranging from about 20 $nm^2$ to about 500 $nm^2$. The nanoparticle layer 30 may be doped with an impurity (not shown) such as nitrogen, hydrogen, boron, phosphorus, or arsenic, which has an energy level different from that of silicon. Bias voltage may be applied through continuous sweeping between the first electrode 22 and the second electrode 24.

For example, current peaks may occur when a bias voltage of about 10 V or higher is applied. Although having different values, current peaks may reproducibly occur at a bias voltage having a target value ranging from about 7 V to about 10 V. Current peaks may occur symmetrically according to a bias voltage variation. For example, when current peaks is directed in a negative direction while decreasing a positive bias voltage between the first electrode 22 and the second electrode 24, current peaks may be directed in a positive direction while increasing a negative bias voltage. At this point, electrical conductivity may occur in a pair at a target bias voltage regardless of a direction of the bias voltage. Accordingly, the nanoparticle layer 30 doped with an impurity has resonance tunneling characteristics, thereby improving electrical characteristics thereof.

Although not shown, the resonance tunneling is a phenomenon where an electron having target energy goes out of a region that is called a quantum well defined by two very close electric potentials, just like going out of a region having no barrier. This is because a matter wave of an electron going out of a barrier becomes a standing wave between barriers, and is resonant with a following electromagnetic wave. To be resonant with an electromagnetic wave, a standing wave has a length that is about n half times (where n is an integer) greater than a wavelength of an electromagnetic wave between barriers. Accordingly, since only an electron having target energy (quantum level) goes out of a quantum well, a negative resistance region in which, when voltage is applied, resistance is decreased is formed.

Thus, the nanoparticle layer 30 is doped with an impurity to have the resonance tunneling characteristics.

Figure 3:
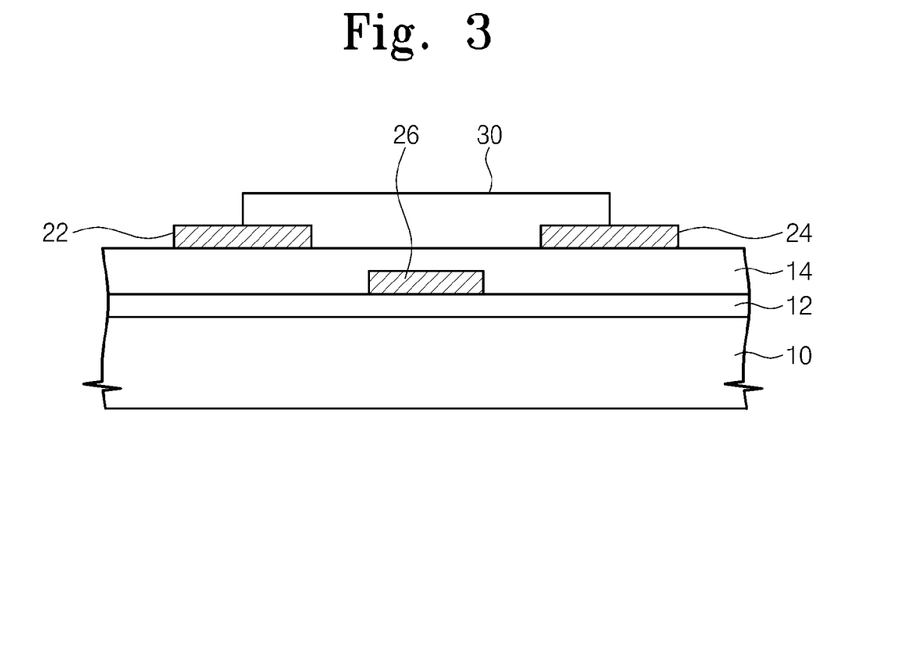
FIG. 3 is a cross-sectional view illustrating a resonance tunneling device according to another embodiment of the present inventive concept.

FIG. 3 is a cross-sectional view illustrating a resonance tunneling device according to another embodiment of the present inventive concept.

Referring to FIG. 3, the resonance tunneling device according to the current embodiment may include a third electrode 26 with a gate dielectric 14 under the nanoparticle layer 30 between the first electrode 22 and the second electrode 24. The third electrode 26 may be disposed between a buffer layer 12 and the gate dielectric 14 on the substrate 10. The nanoparticle layer 30 may be doped with an impurity to have the resonance tunneling characteristics. As described in the previous embodiment, in the nanoparticle layer 30, current peaks may occur at a target bias voltage applied between the first electrode 22 and the second electrode 24. At this point, the target bias voltage may be varied by a gate voltage applied to the third electrode 26. Furthermore, the gate voltage may vary the size and width of the current peaks.

Thus, the resonance tunneling device according to the current embodiment may include the third electrode 26 under or over the nanoparticle layer 30 between the first electrode 22 and the second electrode 24.

A method of manufacturing a resonance tunneling device configured as described above will now be described according to an embodiment of the present inventive concept.

Figure 4:
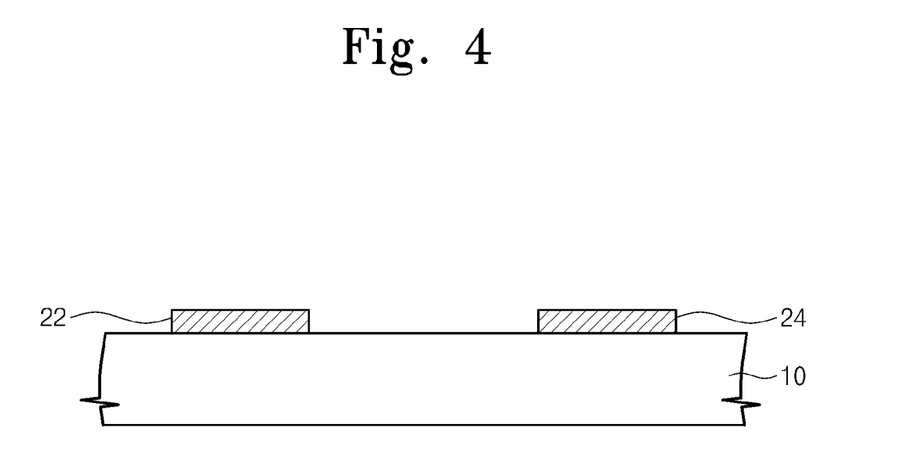
FIGS. 4 to 6 are cross-sectional views illustrating a method of manufacturing a resonance tunneling device according to an embodiment of the present inventive concept.
Figure 5:
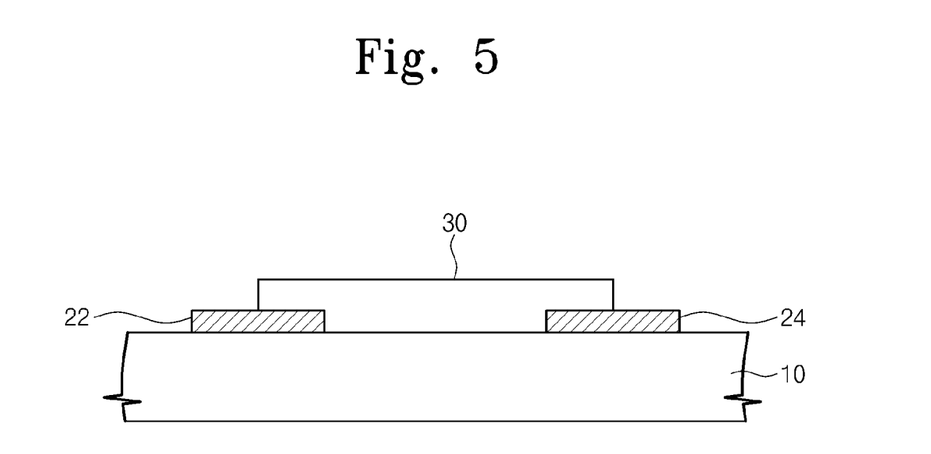
Figure 6:
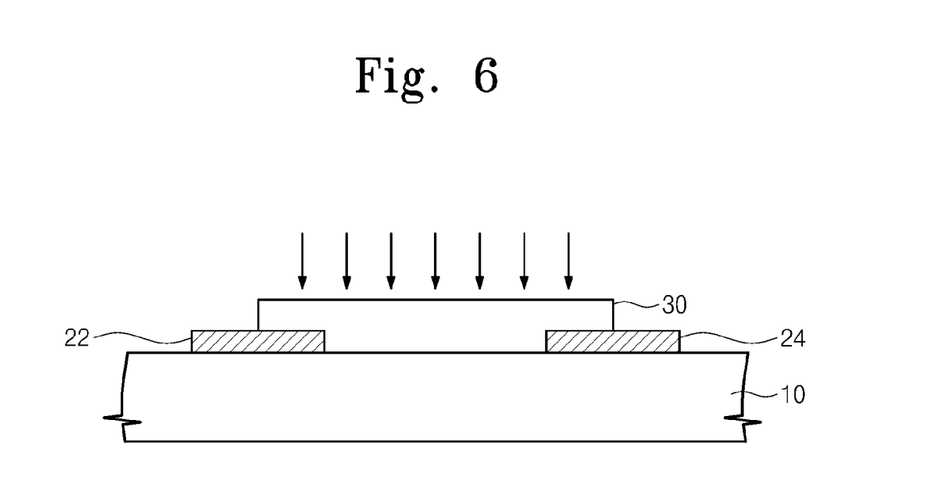
Figure 7:
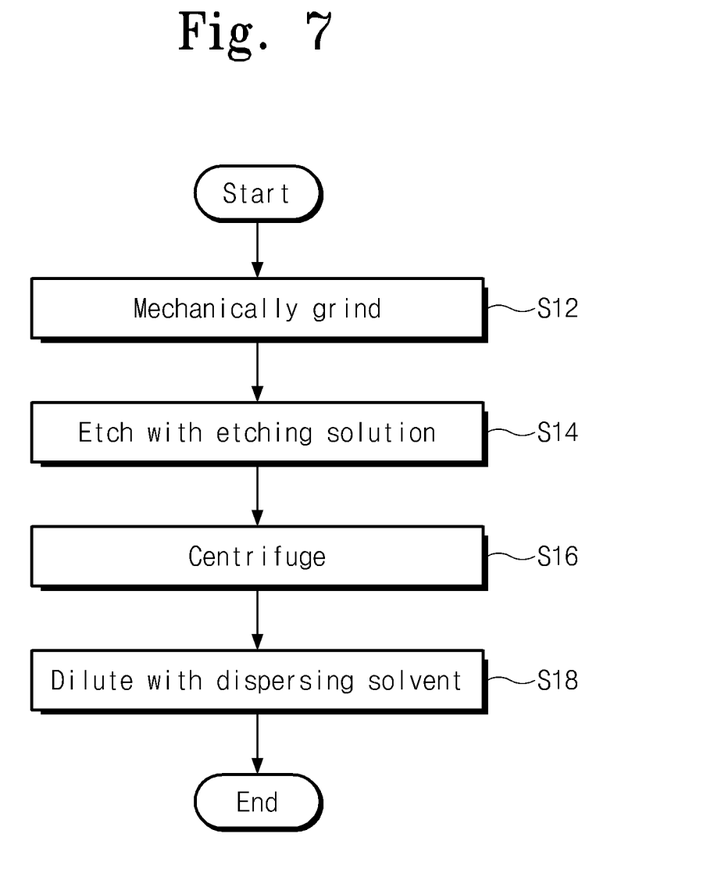
FIG. 7 is a flowchart illustrating a method of preparing a nanoparticle solution according to an embodiment of the present inventive concept.

FIGS. 4 to 6 are cross-sectional views illustrating a method of manufacturing a resonance tunneling device according to an embodiment of the present inventive concept. FIG. 7 is a flowchart illustrating a method of preparing a nanoparticle solution according to the current embodiment.

Referring to FIG. 4, the first electrode 22 and the second electrode 24 are formed on the substrate 10. The substrate 10 may include a wafer of single crystal silicon, a glass substrate, or a plastic board. The first electrode 22 and the second electrode 24 may include: at least one of gold (Au), silver (Ag), copper (Cu), aluminum (Al), tungsten (W), molybdenum (Mo), cobalt (Co), and nickel (Ni); and silicon doped with a conductive impurity. The first electrode 22 and the second electrode 24 may be patterned through a photolithography process.

Referring to FIGS. 5 and 7, the nanoparticle layer 30 is formed from a nanoparticle solution, and is disposed between the first electrode 22 and the second electrode 24. To this end, the nanoparticle layer 30 may be formed using an inkjet printing method, a spin coating method, or a spray method.

The nanoparticle solution may be prepared using the following method. The method may include: mechanically grinding a target material to form primary particles in operation S21; etching the primary particles with an etching solution to form a temporary solution including secondary particles in operation S22; removing supernatants from the temporary solution through a centrifuging process to form a purified solution in operation S23; and diluting the purified solution with a dispersing solvent in operation S24. The target material may be mechanically ground for about 10 hours. The primary particles may have a diameter or length of about 200 nm or greater. The etching solution may include nitric acid ($HNO_3$), hydrofluoric acid (HF), and water ($H_2O$), which may have a mass ratio of about 50:5:50. The secondary particles may include nanoparticles having a diameter or length ranging from about 50 nm to about 200 nm. The centrifuging process may be performed at 3500 rpm for about 30 minutes. The dispersing solvent may include isopropyl alcohol (IPA) or methanol. The target material to grind may be silicon. After the purified solution is diluted with the dispersing solvent, the centrifuging process may be performed again to remove supernatants from the purified solution through a decanting process. The centrifuging process may be repeated a plurality of times.

For example, the nanoparticle layer 30 may be formed by mixing the nanoparticle solution with a colloidal solution, and then by performing an inkjet printing process. After that, the dispersing solvent may be evaporated from the nanoparticle solution.

Thus, according to the current embodiment, the nanoparticle solution including the nanoparticles of silicon may be used to form the nanoparticle layer 30 between the first electrode 22 and the second electrode 24 on the substrate 10.

Referring to FIG. 6, the nanoparticle layer 30 is doped with an impurity. Arrows of FIG. 6 denote an impurity. The impurity may include at least one of nitrogen, phosphorus, and arsenic. The nanoparticle layer 30 may be doped with the impurity using an ion implantation method. An ion implantation method with phosphorus is as follows. The nanoparticle layer 30 may be doped with phosphorus using ion implantation source gas including phosphine, and hydrogen ($H_2$). For example, plasma may be generated with a flow rate of about 10 sccm:10 sccm, ions may be implanted into the nanoparticle layer 30 at a substrate temperature of about 200° C. with an acceleration voltage of about 3 KV and an ion implantation energy of about 15 W for about 10 minutes. After that, a subsequent annealing process may be performed on the nanoparticle layer 30 at a temperature of about 300° C. for about 1 hour. As such, the nanoparticle layer 30 is doped with an impurity to have the resonance tunneling characteristics.

Thus, the method of manufacturing the resonance tunneling device according to the current embodiment may include the forming of the nanoparticle layer 30 on the substrate 10 by using the nanoparticle solution, and the implanting of the ions into the nanoparticle layer 30.

A method of manufacturing a resonance tunneling device according to another embodiment of the present inventive concept may include forming the nanoparticle layer 30 from a nanoparticle solution including nanoparticles doped with an impurity. That is, referring to FIG. 5, a method of manufacturing a resonance tunneling device according to another embodiment of the present inventive concept may include forming the nanoparticle layer 30 from a nanoparticle solution including nanoparticles doped with an impurity, on the substrate 10, the first electrode 22, and the second electrode 24. The nanoparticle solution including nanoparticles doped with an impurity may be prepared as follows. The nanoparticle solution may include nanoparticles finally doped with an impurity. Alternatively, the nanoparticle solution may include nanoparticles doped with an impurity from the start.

Figure 8:
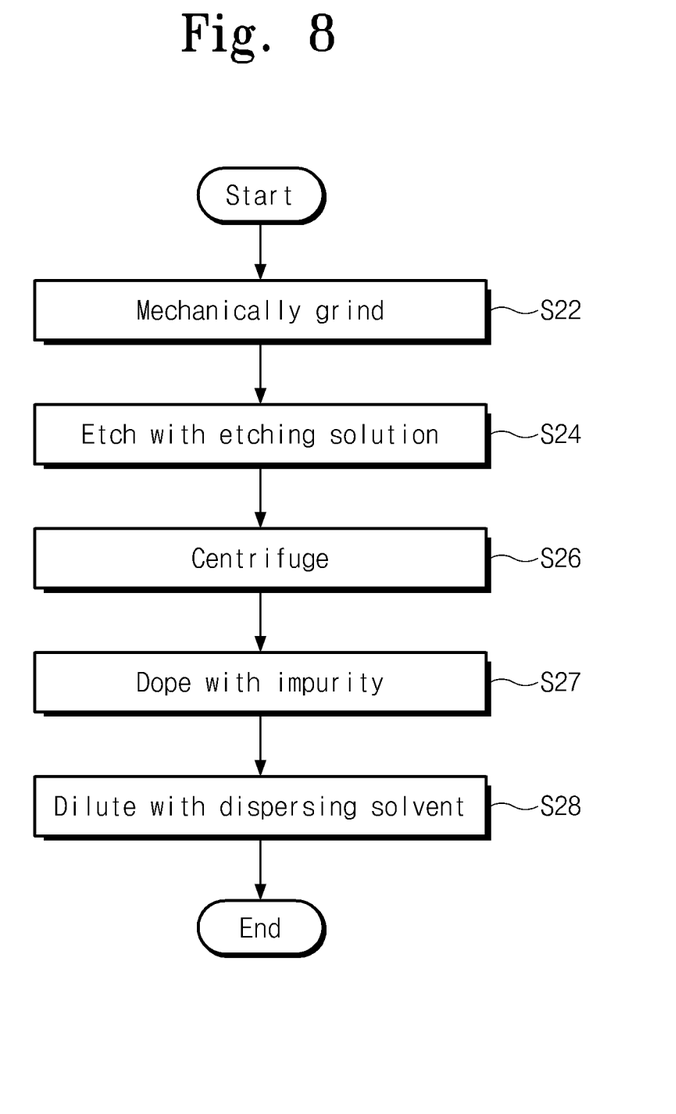
FIG. 8 is a flowchart illustrating a method of preparing a nanoparticle solution including nanoparticles finally doped with an impurity according to an embodiment of the present inventive concept.

FIG. 8 is a flowchart illustrating a method of preparing a nanoparticle solution including nanoparticles finally doped with an impurity.

Referring to FIG. 8, a method of preparing a nanoparticle solution including nanoparticles finally doped with an impurity may include: mechanically grinding a target material to form primary particles in operation S22; etching the primary particles with an etching solution to form a temporary solution including secondary particles in operation S24; removing supernatants from the temporary solution through a centrifuging process to form a purified solution in operation S26; doping nanoparticles in the purified solution with an impurity in operation S27; and diluting the purified solution with a dispersing solvent in operation S28. The doping of the nanoparticles with the impurity in operation S27 may include a heat treating process. The impurity may include a conductive metal as well as nitrogen, hydrogen, boron, phosphorus, or arsenic, which has an energy level different from that of silicon. Thus, in the method of preparing the nanoparticle solution, the impurity may be put into the purified solution, and the nanoparticles in the purified solution may be doped with the impurity.

Figure 9:
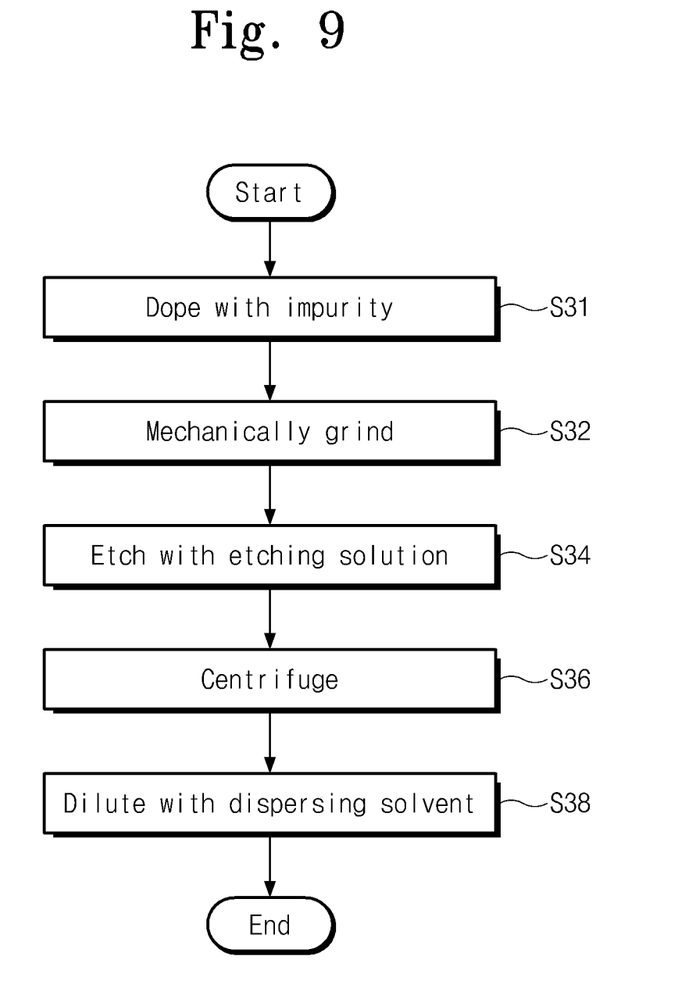
FIG. 9 is a flowchart illustrating a method of preparing a nanoparticle solution including nanoparticles doped with an impurity from the start according to an embodiment of the present inventive concept.

FIG. 9 is a flowchart illustrating a method of preparing a nanoparticle solution including nanoparticles doped with an impurity from the start. Referring to FIG. 9, a method of preparing a nanoparticle solution may include doping a target material with an impurity from the start in operation S31. The doping of the target material in operation S31 may include an ion implantation process using the impurity, and a diffusing process. The target material may include bulk silicon. As described in the previous embodiment, the method of preparing the nanoparticle solution may include: mechanically grinding the target material to form primary particles in operation S32; etching the primary particles with an etching solution to form a temporary solution including secondary particles in operation S34; removing supernatants from the temporary solution through a centrifuging process to form a purified solution in operation S36; and diluting the purified solution with a dispersing solvent in operation S38.

Thus, the method of manufacturing the resonance tunneling device according to the current embodiment may include the forming of the nanoparticle layer 30 from the nanoparticle solution including the nanoparticles doped with the impurity.

According to the embodiments, a nanoparticle layer may be formed from a nanoparticle solution, on a substrate or between electrodes on the substrate. The nanoparticle layer may include silicon nanoparticles doped with an impurity. The impurity may include a dopant such as nitrogen, hydrogen, boron, phosphorus, or arsenic, which has an energy level different from that of silicon. The impurity may provide the nanoparticle layer with the resonance tunneling characteristics such that current peaks occur at a target bias voltage applied between electrodes. Accordingly, electrical characteristics of the nanoparticle layer can be improved.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A resonance tunneling device comprising:
   a substrate;
   a plurality of electrodes disposed on the substrate; and
   a nanoparticle layer disposed between the electrodes, and doped with an impurity,
   wherein the nanoparticle layer uses the impurity to exhibit resonance tunneling where a current peak occurs at a target bias voltage applied between the electrodes.

2. The resonance tunneling device of claim 1, wherein the nanoparticle layer comprises rod nanoparticles or plate nanoparticles.

3. The resonance tunneling device of claim 2, wherein the nanoparticle layer comprises silicon.

4. The resonance tunneling device of claim 3, wherein the impurity comprises at least one of nitrogen, boron, phosphorus, arsenic, and hydrogen.

5. The resonance tunneling device of claim 1, further comprising:
   a dielectric disposed under or over the nanoparticle layer; and
   a gate electrode disposed under or over the dielectric between the electrodes.

* * * * *